(12) United States Patent
Watanabe et al.

(10) Patent No.: US 9,312,477 B2
(45) Date of Patent: Apr. 12, 2016

(54) SEMICONDUCTOR STORAGE DEVICE WITH MAGNETORESISTIVE ELEMENT

(71) Applicant: KABUSHIKI KAISHA TOSHIBA, Tokyo (JP)

(72) Inventors: Daisuke Watanabe, Yokohama (JP); Katsuya Nishiyama, Yokohama (JP); Toshihiko Nagase, Yokohama (JP); Koji Ueda, Kamakura (JP); Tadashi Kai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/573,231

(22) Filed: Dec. 17, 2014

(65) Prior Publication Data
US 2015/0171317 A1    Jun. 18, 2015

Related U.S. Application Data

(63) Continuation of application No. 14/152,286, filed on Jan. 10, 2014, now Pat. No. 8,946,837, which is a continuation-in-part of application No. 13/424,136, filed on Mar. 19, 2012, now Pat. No. 8,659,103.

(30) Foreign Application Priority Data

Jul. 4, 2011    (JP) .................................. 2011-148444

(51) Int. Cl.
*H01L 29/82*    (2006.01)
*H01L 43/10*    (2006.01)
(Continued)

(52) U.S. Cl.
CPC .............. *H01L 43/10* (2013.01); *H01L 27/228* (2013.01); *H01L 43/02* (2013.01); *H01L 43/08* (2013.01)

(58) Field of Classification Search
CPC ..... H01L 43/08; H01L 29/82; H01L 23/5226; H01L 23/528; H01L 27/222; H01L 43/065; G11C 11/16
USPC ........ 257/20, 414, 421–427, E29.323; 438/3; 365/157–158, 171–173; 360/324–326
See application file for complete search history.

(56) References Cited

U.S. PATENT DOCUMENTS

| 6,816,347 B2 | 11/2004 | Koi et al. |
| 7,663,197 B2 | 2/2010 | Nagase |

(Continued)

FOREIGN PATENT DOCUMENTS

| JP | 2002-124716 A | 4/2002 |
| JP | 2008-109118 | 5/2008 |

(Continued)

OTHER PUBLICATIONS

U.S. Appl. No. 13/049,806, filed Mar. 16, 2011, Yamakawa et al.
(Continued)

*Primary Examiner* — Jami M Valentine
(74) *Attorney, Agent, or Firm* — Knobbe, Martens, Olson & Bear, LLP

(57) ABSTRACT

According to one embodiment, a semiconductor storage device is disclosed. The device includes first magnetic layer, second magnetic layer, first nonmagnetic layer between them. The first magnetic layer includes a structure in which first magnetic material film, second magnetic material film, and nonmagnetic material film between the first and second magnetic material films are stacked. The first magnetic material film is nearest to the first nonmagnetic layer in the first magnetic layer. The nonmagnetic material film includes at least one of Ta, Zr, Nb, Mo, Ru, Ti, V, Cr, W, Hf. The second magnetic material film includes stacked materials, including first magnetic material nearest to the first nonmagnetic layer among the stacked materials, and second magnetic material which is same magnetic material as the first magnetic material and has smaller thickness than the first magnetic material.

13 Claims, 11 Drawing Sheets

(51) Int. Cl.
*H01L 43/08* (2006.01)
*H01L 27/22* (2006.01)
*H01L 43/02* (2006.01)

(56) References Cited

U.S. PATENT DOCUMENTS

| | | | |
|---|---|---|---|
| 7,768,824 B2 | 8/2010 | Yoshikawa et al. | |
| 7,924,607 B2 | 4/2011 | Yoshikawa et al. | |
| 8,036,025 B2 | 10/2011 | Nagase | |
| 8,098,514 B2 | 1/2012 | Nagase et al. | |
| 8,299,552 B2 | 10/2012 | Nagase et al. | |
| 8,305,801 B2 | 11/2012 | Daibou et al. | |
| 8,363,462 B2 | 1/2013 | Nagase et al. | |
| 8,653,614 B2 | 2/2014 | Ikeno et al. | |
| 8,659,103 B2 | 2/2014 | Watanabe et al. | |
| 8,670,268 B2 | 3/2014 | Nagase et al. | |
| 8,897,060 B2 | 11/2014 | Nakayama et al. | |
| 2002/0044479 A1 | 4/2002 | Ikeda | |
| 2004/0100855 A1* | 5/2004 | Saito | B82Y 10/00 365/232 |
| 2006/0114714 A1 | 6/2006 | Kanegae | |
| 2007/0206333 A1 | 9/2007 | Watanabe et al. | |
| 2008/0231998 A1 | 9/2008 | Yoshikawa et al. | |
| 2008/0253174 A1 | 10/2008 | Yoshikawa et al. | |
| 2009/0080238 A1 | 3/2009 | Yoshikawa et al. | |
| 2009/0080239 A1* | 3/2009 | Nagase | H01L 27/228 365/158 |
| 2009/0141410 A1 | 6/2009 | Jogo et al. | |
| 2010/0096716 A1* | 4/2010 | Ranjan | B82Y 10/00 257/421 |
| 2010/0230770 A1 | 9/2010 | Yoshikawa et al. | |
| 2011/0007560 A1 | 1/2011 | Dieny et al. | |
| 2011/0073970 A1 | 3/2011 | Kai | |
| 2011/0116305 A1 | 5/2011 | Nagamine et al. | |
| 2011/0211389 A1 | 9/2011 | Yoshikawa et al. | |
| 2011/0222335 A1 | 9/2011 | Yoshikawa et al. | |
| 2012/0008381 A1 | 1/2012 | Nagase | |
| 2012/0068284 A1* | 3/2012 | Kitagawa | H01L 43/08 257/421 |
| 2012/0068285 A1* | 3/2012 | Kitagawa | H01F 10/3286 257/421 |
| 2012/0069640 A1 | 3/2012 | Nagase et al. | |
| 2012/0088125 A1 | 4/2012 | Nishiyama et al. | |
| 2012/0099369 A1 | 4/2012 | Kai et al. | |
| 2012/0112297 A1 | 5/2012 | Yamakawa et al. | |
| 2012/0217476 A1 | 8/2012 | Ikeno et al. | |
| 2012/0241881 A1 | 9/2012 | Daibou et al. | |
| 2012/0243305 A1 | 9/2012 | Nakayama et al. | |
| 2012/0294079 A1 | 11/2012 | Ohmori et al. | |
| 2013/0001713 A1 | 1/2013 | Ueda et al. | |
| 2013/0001714 A1 | 1/2013 | Nishiyama et al. | |
| 2013/0009259 A1 | 1/2013 | Watanabe et al. | |
| 2014/0117478 A1 | 5/2014 | Ikeno et al. | |
| 2014/0124884 A1 | 5/2014 | Watanabe et al. | |
| 2014/0131823 A1 | 5/2014 | Nagase et al. | |

FOREIGN PATENT DOCUMENTS

| | | |
|---|---|---|
| JP | 2008-252018 A | 10/2008 |
| JP | 2009-081216 A | 4/2009 |
| JP | 2009-081315 A | 4/2009 |
| JP | 2009-239052 A | 10/2009 |
| JP | 2010-010720 A | 1/2010 |
| JP | 2010-016408 A | 1/2010 |
| JP | 2010-232499 A | 10/2010 |
| JP | 2011-071352 | 4/2011 |
| JP | 2012-243933 | 12/2012 |
| WO | WO 2010/137679 | 12/2010 |
| WO | WO 2011/036795 | 3/2011 |

OTHER PUBLICATIONS

U.S. Appl. No. 13/424,136, filed Mar. 19, 2012, Watanabe et al.
U.S. Appl. No. 13/432,626, filed Mar. 28, 2012, Nakayama et al.
U.S. Appl. No. 14/152,286, filed Jan. 10, 2014, Watanabe et al.
U.S. Appl. No. 13/233,906, filed Sep. 15, 2011, Nagase et al.
U.S. Appl. No. 13/407,630, filed Feb. 28, 2012, Ikeno et al.
U.S. Appl. No. 13/427,732, filed Mar. 22, 2012, Nagase et al.
U.S. Appl. No. 14/147,903, filed Jan. 6, 2014, Ikeno et al.
U.S. Appl. No. 14/159,057, filed Jan. 20, 2014, Nagase et al.
Worledge, D.C., et al. "Spin torque switching of perpendicular Ta|CoFeB|MgO-based magnetic tunnel junctions", Applied Physics Letters 98, 022501 (2011), in 3 pages.
Background Art Information (Concise Explanation for JP 2009-81216), Toshiba, Jan. 19, 2011.
Background Art Information, Toshiba, Dec. 8, 2011.
Ikeda et al., "A Perpedicular-Anisotrophy CoFeB—MgO Magnetic Tunnel Junction", Nature Materials, 2804 pp. 1-3 Jul. 2010.
Japanese Office Action dated Oct. 14, 2014 for JP Application No. 2011-148444 filed Jul. 4, 2011.
Japanese Office Action dated Oct. 14, 2014 for JP Application No. 2011-148445 filed Jul. 4, 2011.

* cited by examiner

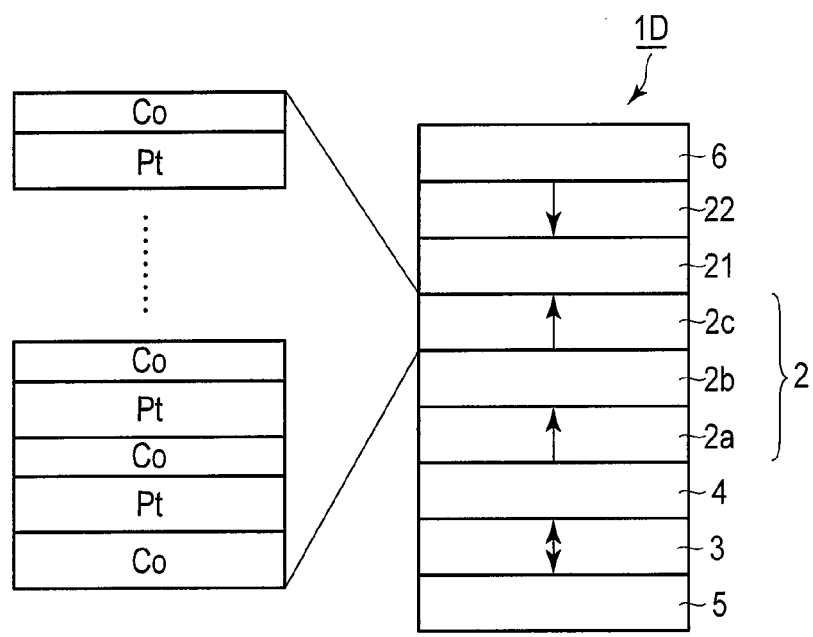
F I G. 5
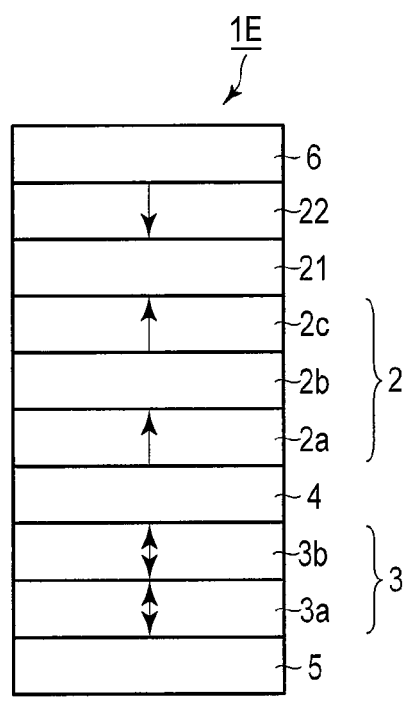
F I G. 6

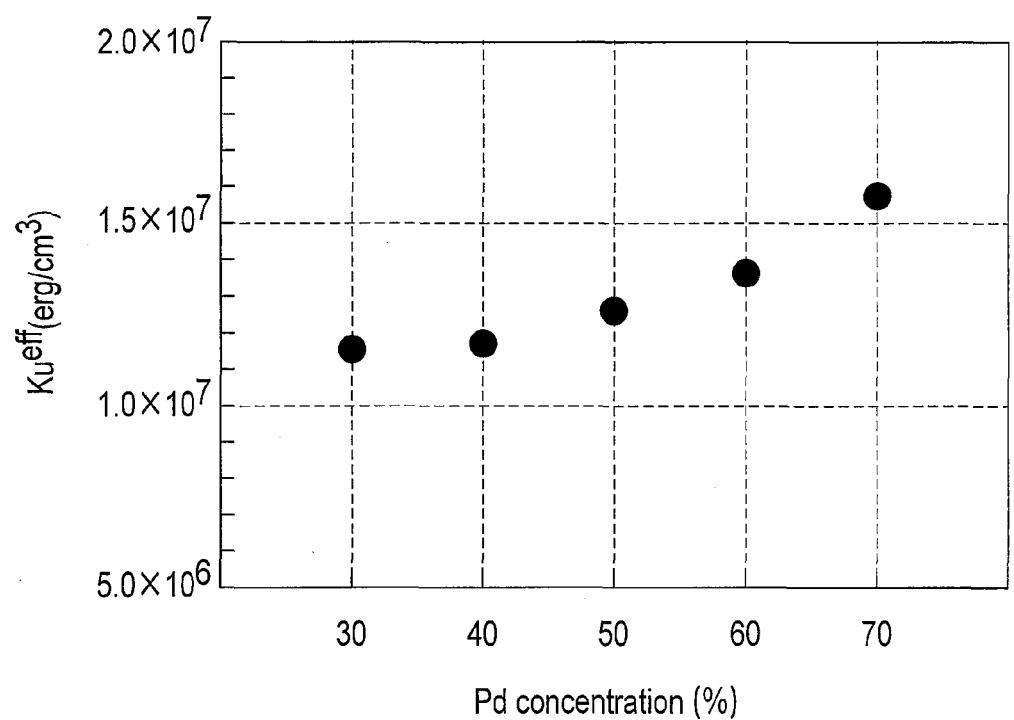
F I G. 7

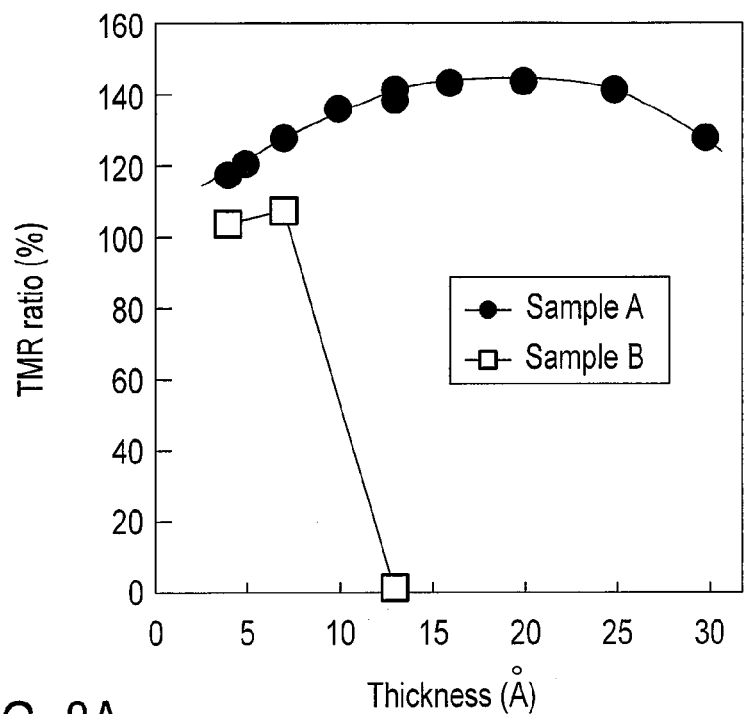
F I G. 8A
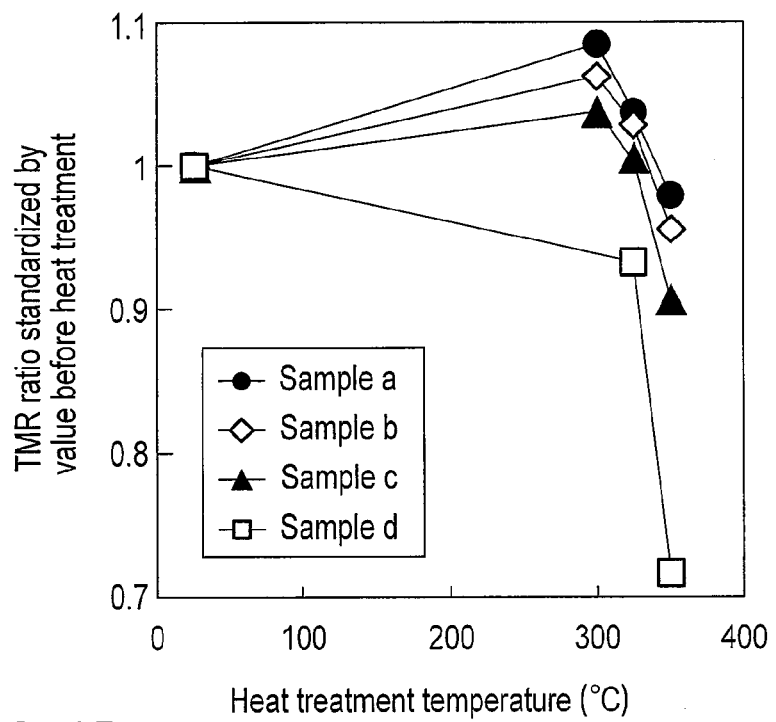
F I G. 8B

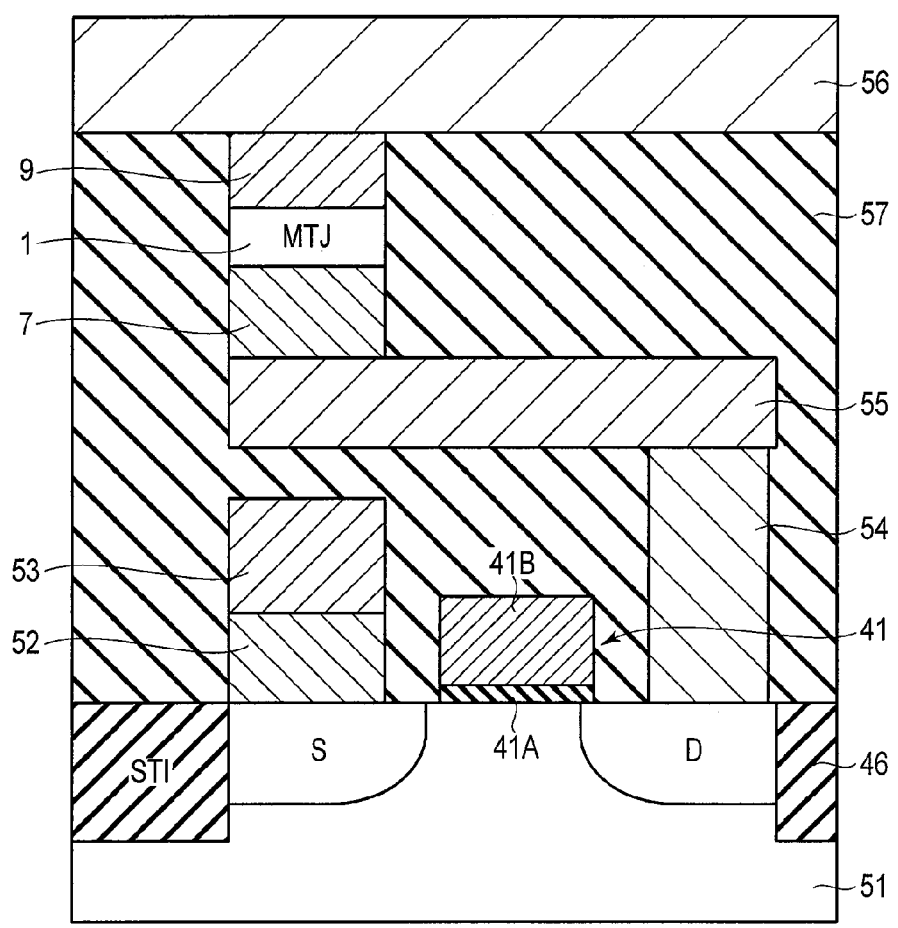
F I G. 11

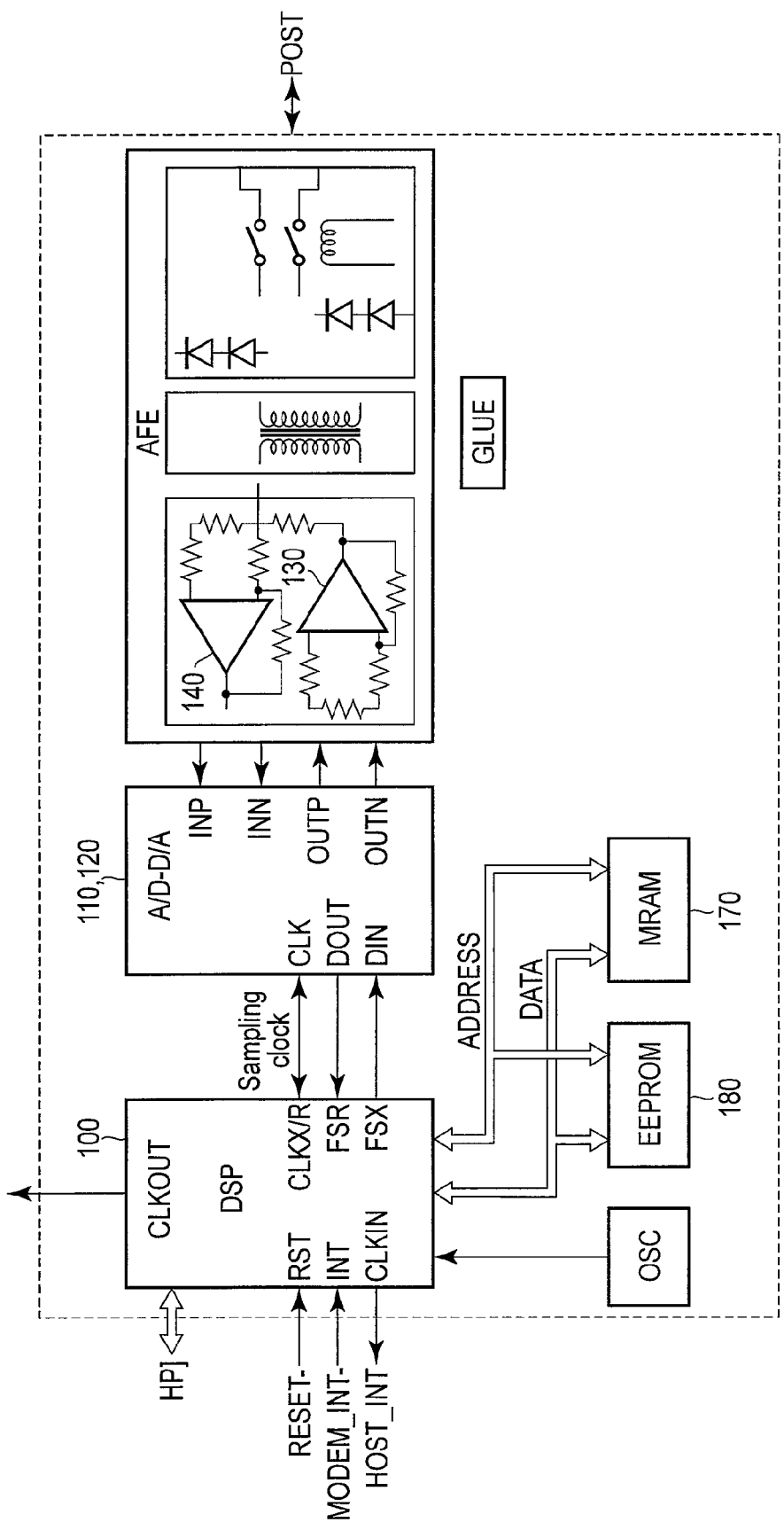
F I G. 12

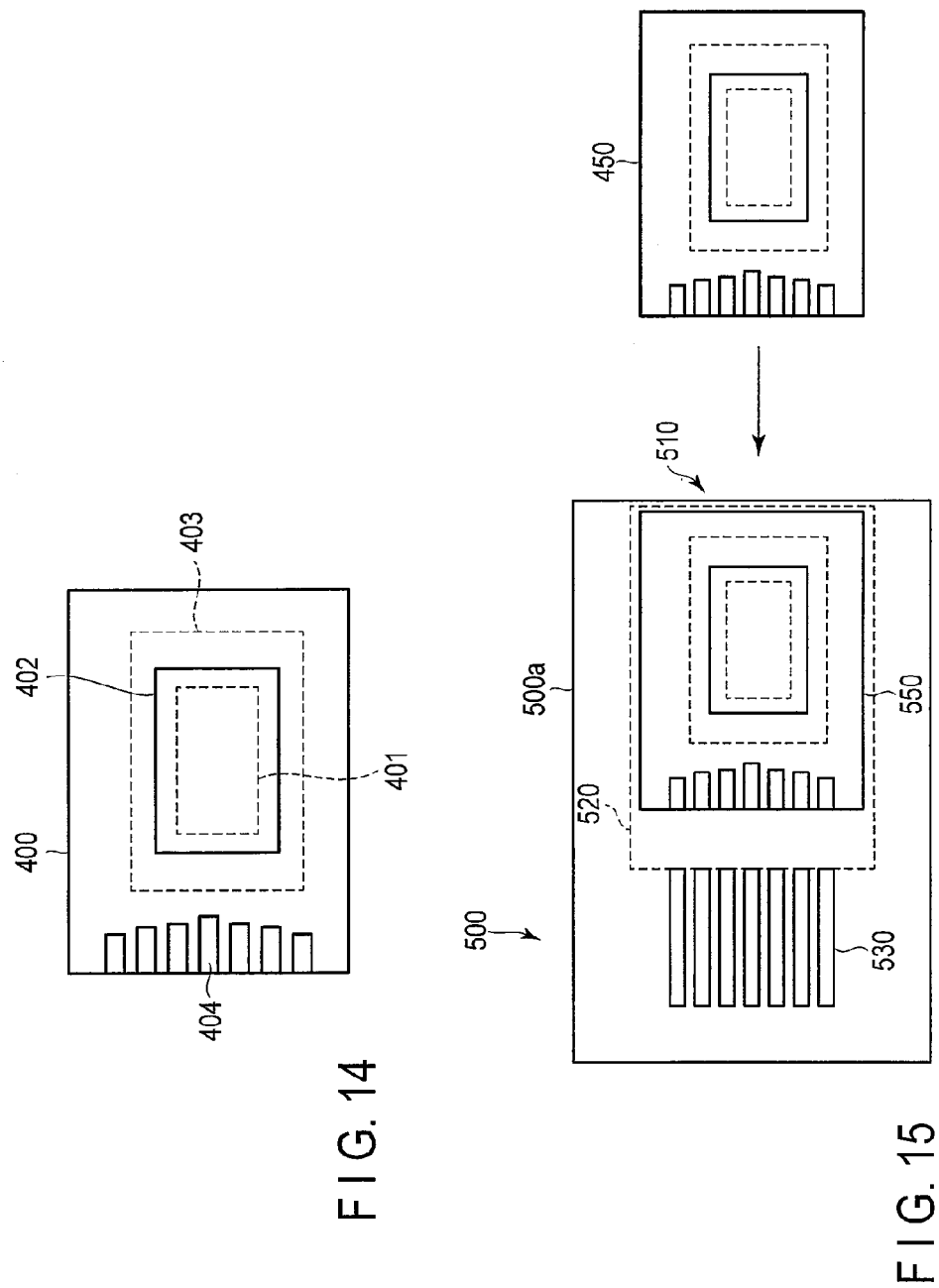

SEMICONDUCTOR STORAGE DEVICE WITH MAGNETORESISTIVE ELEMENT

CROSS REFERENCE TO RELATED APPLICATIONS

This application is a Continuation of U.S. patent application Ser. No. 14/152,286, filed Jan. 10, 2014, which is a Continuation-in-Part Application of U.S. patent application Ser. No. 13/424,136, filed Mar. 19, 2012 and based upon and claiming the benefit of priority from Japanese Patent Application No. 2011-148444, filed Jul. 4, 2011, the entire contents of all of which are incorporated herein by reference.

FIELD

Embodiments described herein relate generally to a semiconductor storage device.

BACKGROUND

Recently, a magnetic random access memory (hereinafter referred to as an MRAM) that uses the magnetoresistive effect of a ferromagnetic body has been drawing more attention as a next-generation solid-state nonvolatile memory which has a high capacity and which is capable of high-speed reading/writing and capable of operating with low power consumption. In particular, a magnetoresistive element having a ferromagnetic tunnel junction has been drawing attention since the discovery of a high magnetoresistance change rate shown by the magnetoresistive element. The ferromagnetic tunnel junction has a three-layer stack structure comprising a storage layer variable in magnetization direction, an insulator layer, and a fixed layer which faces the storage layer and which maintains a predetermined magnetization direction.

This magnetoresistive element having the ferromagnetic tunnel junction is also referred to as a magnetic tunnel junction (MTJ) element. As a writing method for this element, a writing (spin transfer torque writing) method that uses spin-momentum-transfer (SMT) has been proposed. According to this method, a spin-polarized current is passed through the magnetoresistive element to switch the magnetization direction of the storage layer. The amount of spin-polarized electrons to be injected may be smaller if the volume of a magnetic layer that constitutes the storage layer is smaller. Thus, this writing method is expected to enable both element miniaturization and current reduction.

It has been considered to use, as a ferromagnetic material that constitutes the magnetoresistive element, what is known as a perpendicular magnetization film having a magnetization easy axis (an axis of easy magnetization) in a direction perpendicular to a film plane. When magnetocrystalline anisotropy is used in a perpendicular magnetization configuration, shape anisotropy is not used, so that the element shape can be smaller than that of an in-plane magnetization configuration. Dispersion in a magnetization easy direction can also be reduced. Therefore, the use of a material having high magnetocrystalline anisotropy is expected to enable the maintenance of thermal disturbance resistance and also enable both miniaturization and current reduction.

The problem that arises when the MTJ is formed by the perpendicular magnetization type is that materials included in an underlying layer for adjusting crystal orientation and the storage layer diffuse due to a heat treatment and the magnetoresistance ratio (MR ratio) deteriorates. A technique that addresses this problem has been known. According to this technique, a crystallization accelerating film for accelerating crystallization is formed in contact with an interface magnetic film having an amorphous structure. Thereby, crystallization is accelerated from the side of a tunnel barrier layer, and the interface between the tunnel barrier layer and the interface magnetic film is aligned to achieve a high MR ratio. The use of this technique enables a high MR ratio. However, when a heat treatment associated with element fabrication is taken into consideration, it is preferable that the MR ratio (or resistance value) does not change when a heat treatment is additionally conducted after the initial condition.

BRIEF DESCRIPTION OF THE DRAWINGS

FIG. 5 is a sectional view of a magnetoresistive element according to a fifth embodiment;

FIG. 6 is a sectional view of a magnetoresistive element according to a sixth embodiment;

FIG. 7 is a graph showing the Pd concentration dependence of perpendicular magnetic anisotropy in a storage layer;

FIGS. 8A and 8B are graphs showing the thickness dependence and heat treatment temperature dependence of a TMR ratio according to the embodiment;

FIG. 11 is a sectional view of a memory cell in the MRAM according to the seventh embodiment;

FIG. 12 is a block diagram showing a DSL data path unit of a DSL modem as an application example;

FIG. 14 is a top view of an MRAM card as an application example;

FIG. 15 is a plan view of a card insertion type transfer apparatus as an application example;

DETAILED DESCRIPTION

Components having substantially the same functions and configurations are provided with the same reference signs in the following explanations and are repeatedly described only when necessary. It is to be noted that the drawings are schematic and that the relation between the thickness and planar dimensions, the ratio of the thickness of layers, etc. are different from real ones. Therefore, the following description should be considered to judge specific thickness and dimensions. It is also to be noted that the drawings include parts different in the relation and ratio of their dimensions.

In general, according to one embodiment, a semiconductor storage device is disclosed. The device includes a first magnetic layer, a second magnetic layer, a first nonmagnetic layer provided between the first magnetic layer and the second magnetic layer. The first magnetic layer includes a structure in which a first magnetic material film, a second magnetic material film, and a nonmagnetic material film provided between the first magnetic material film and the second magnetic material film are stacked, the first magnetic material film being nearest to the first nonmagnetic layer in the first magnetic layer, the nonmagnetic material film including at least one of Ta, Zr, Nb, Mo, Ru, Ti, V, Cr, W, and Hf. The second magnetic material film includes a stacked plurality of materials, the stacked plurality of materials including a first magnetic material being nearest to the first nonmagnetic layer among the stacked plurality of materials, and a second magnetic material being same magnetic material as the first magnetic material and having smaller thickness than the first magnetic material.

First Embodiment

Figure 1:
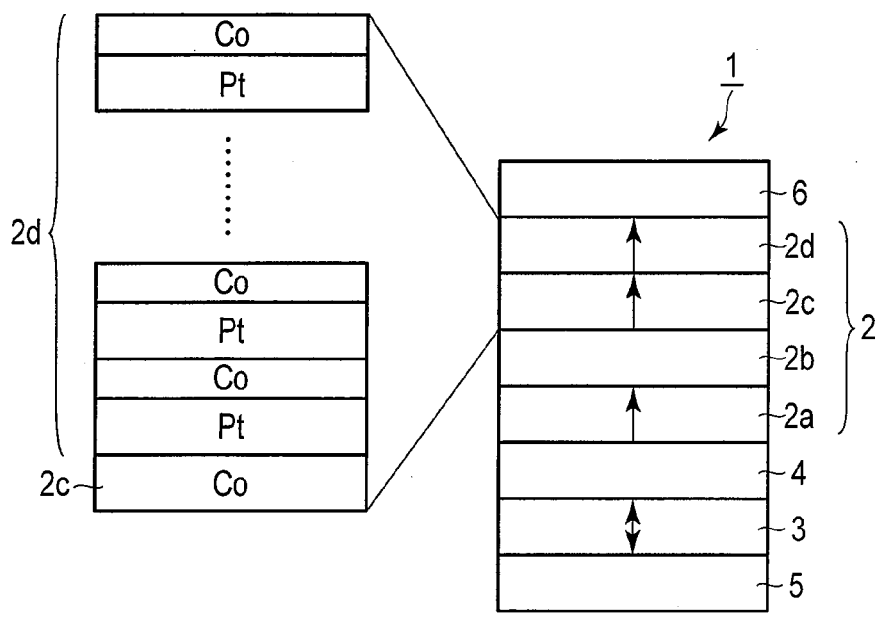
FIG. 1 is a sectional view of a magnetoresistive element according to a first embodiment.

FIG. 1 is a sectional view of a magnetoresistive element according to the first embodiment.

In sectional views in and after FIG. 1, arrows indicate magnetization directions. The magnetoresistive element in the present specification and claims means a tunneling magnetoresistive (TMR) element that uses a semiconductor or an insulator as a tunnel barrier layer. Although the main components of the magnetoresistive element are shown in the sectional views in and after FIG. 1, more layers may be included as far as the shown configurations are included.

Writing is performed in a magnetoresistive element 1 by a spin transfer torque magnetization reversal method. That is, the magnetoresistive element 1 changes the relative angle between the magnetizations of a storage layer and a fixed layer into a parallel or antiparallel state (i.e., minimum or maximum resistance) in accordance with the direction of a spin-polarized current which is passed through each layer in a direction perpendicular to a film plane. The magnetoresistive element 1 thus associates the state with binary information "0" or "1" and thereby stores the information.

As shown in FIG. 1, the magnetoresistive element 1 includes at least two magnetic layers 2 and 3, and a nonmagnetic layer 4 provided between the magnetic layer 2 and the magnetic layer 3. The magnetic layer 3 is provided on an underlying layer 5, and has a magnetization easy axis in the direction perpendicular to the film plane. The magnetization direction of the magnetic layer 3 is variable. Here, the variable magnetization direction means that the magnetization direction changes before and after writing. In the present specification, the film plane means the upper surface of a target layer. Hereinafter, the magnetic layer 3 is referred to as a storage layer (free layer, magnetization free layer, magnetization variable layer, or recording layer). Detailed properties of the storage layer 3 will be described later. The magnetization in the direction perpendicular to the film plane is referred to as perpendicular magnetization.

The magnetic layer 2 has a magnetization easy axis in the direction perpendicular to the film plane, and its magnetization direction is invariable in contrast to the storage layer 3. Here, the invariable magnetization direction means that the magnetization direction does not change before and after writing. Hereinafter, the magnetic layer 2 is referred to as a fixed layer (magnetization fixed layer, reference layer, pin layer, standard layer, or magnetization standard layer). The fixed layer 2 according to the present embodiment has a structure in which a first magnetic material film 2a, a nonmagnetic material film 2b, a second magnetic material film 2c, and a third magnetic material film 2d are stacked in this order from the side contacting the nonmagnetic layer 4.

When a structure is regarded as essentially equivalent to the structure according to the present embodiment, the names of the components therein are not limited to the above-mentioned names. Detailed properties of the fixed layer 2 will be described later. The magnetization direction of the fixed layer 2 is, by way of example, opposite (upward) to an unshown substrate provided under the underlying layer 5 in FIG. 1, but may be toward (downward) the substrate.

FIG. 1 also illustrates an enlarged sectional view of the second magnetic material film 2c and the third magnetic material film 2d. The enlarged sectional view will be described later.

The nonmagnetic layer 4 is also referred to as a tunnel barrier layer, and is made of an insulating film of, for example, an oxide. Detailed properties of the nonmagnetic layer 4 will be described later.

The magnetoresistive element 1 according to the present embodiment is a magnetoresistive element used for the spin transfer torque writing method. That is, in writing, a current is passed from the fixed layer 2 to the storage layer 3 or from the storage layer 3 to the fixed layer 2 in the direction perpendicular to the film plane such that electrons having spin information are transferred from the fixed layer 2 to the storage layer 3. The spin angular momentum of the transferred electrons is moved to the electrons in the storage layer 3 in accordance with the conservation law of the spin angular momentum such that the magnetization of the storage layer 3 is switched.

For example, when the magnetization direction of the storage layer 3 is antiparallel to the magnetization direction of the fixed layer 2, a current is passed from the storage layer 3 to the fixed layer 2. In this case, electrons run from the fixed layer 2 to the storage layer 3. At this moment, electrons spin-polarized by the fixed layer 2 runs to the storage layer 3 through the nonmagnetic layer 4, and the spin angular momentum is moved to the storage layer 3 so that the magnetization direction of the storage layer 3 is switched and becomes parallel to the magnetization direction of the fixed layer 2.

On the other hand, when the magnetization direction of the storage layer 3 is parallel to the magnetization direction of the fixed layer 2, a current is passed from the fixed layer 2 to the storage layer 3. In this case, electrons run from the storage layer 3 to the fixed layer 2. At this moment, electrons spin-polarized by the storage layer 3 run to the fixed layer 2 through the nonmagnetic layer 4, and electrons having the same spin as the magnetization direction of the fixed layer 2 pass through the fixed layer 2. However, electrons having a spin opposite to the magnetization direction of the fixed layer 2 are reflected at the interface between the nonmagnetic layer 4 and the fixed layer 2, and run to the storage layer 3 through the nonmagnetic layer 4. As a result, the spin angular momentum is moved to the storage layer 3 so that the magnetization direction of the storage layer 3 is switched and becomes antiparallel to the magnetization direction of the fixed layer 2.

In order to read information from the magnetoresistive element 1, a read current that does not switch the magnetization of the storage layer 3 is passed across the storage layer 3 and the fixed layer 2 through the nonmagnetic layer 4. Thus, the information can be read from the magnetoresistive element 1.

The magnetoresistive element 1 according to the first embodiment shown in FIG. 1 shows what is known as a top pin structure in which the storage layer 3 is formed on the underlying layer 5, and the fixed layer 2 is formed on the nonmagnetic layer 4. The underlying layer 5 is used to control crystallinity such as crystal orientation and crystal grain diameter of the layers higher than the storage layer 3. Detailed properties of the underlying layer 5 will be described later. A cap layer 6 may be further formed on the fixed layer 2. The cap layer 6 mainly function as a protective layer, for example, to prevent the oxidizing of the magnetic layers.

Second Embodiment

Figure 2:
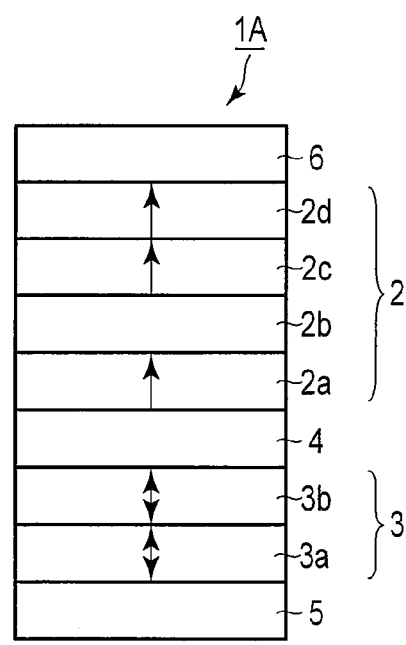
FIG. 2 is a sectional view of a magnetoresistive element according to a second embodiment.

FIG. 2 is a sectional view of a magnetoresistive element according to the second embodiment.

A magnetoresistive element 1A according to the second embodiment has the configuration of the magnetoresistive element 1 according to the first embodiment shown in FIG. 1 wherein a storage layer 3 has a structure in which a magnetic film 3a and a interface magnetic film 3b that contacts a nonmagnetic layer 4 are stacked. The magnetic film 3a and the interface magnetic film 3b are made of different materials.

The interface magnetic film 3b is in contact with the nonmagnetic layer 4, and therefore has the effect of lessening a lattice mismatch at the interface. The use of a material having high spin polarization for the interface magnetic film 3b allows high tunneling magnetoresistance ratio (TMR ratio) and high spin transfer torque efficiency. Detailed properties of the magnetic film 3a and the interface magnetic film 3b will be described later.

Third Embodiment

Figure 3:
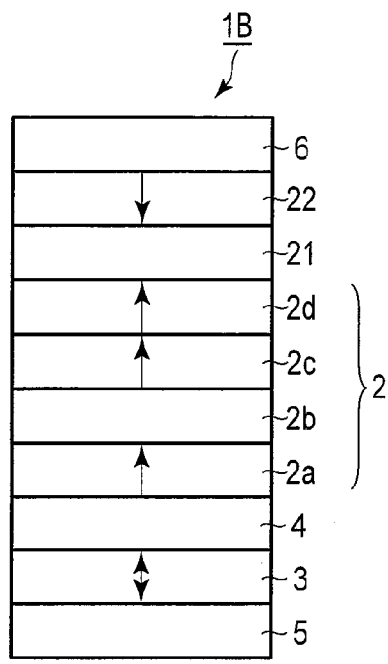
FIG. 3 is a sectional view of a magnetoresistive element according to a third embodiment.

FIG. 3 is a sectional view of a magnetoresistive element according to the third embodiment.

A magnetoresistive element 1B according to the third embodiment has the configuration of the magnetoresistive element 1 according to the first embodiment shown in FIG. 1 wherein a nonmagnetic layer 21 and a bias layer (shift adjustment layer) 22 are inserted between a fixed layer 2 and a cap layer 6.

The bias layer 22 is a perpendicular magnetization film made of a ferromagnetic body and having a magnetization easy axis in the direction perpendicular to the film plane. The magnetization direction of the bias layer 22 is fixed to a direction opposite (reverse or antiparallel) to the magnetization direction of the fixed layer 2. The bias layer 22 has the effect of adjusting, to an opposite direction, an offset of storage layer switching characteristics which results from a leakage magnetic field from the fixed layer 2 and which is a drawback when the magnetoresistive element is miniaturized. That is, the bias layer 22 has the effect of lessening and adjusting the shift of a switching current of a storage layer 3 resulting from the leakage magnetic field from the fixed layer 2. Detailed properties of the nonmagnetic layer 21 and the bias layer 22 will be described later.

Fourth Embodiment

Figure 4:
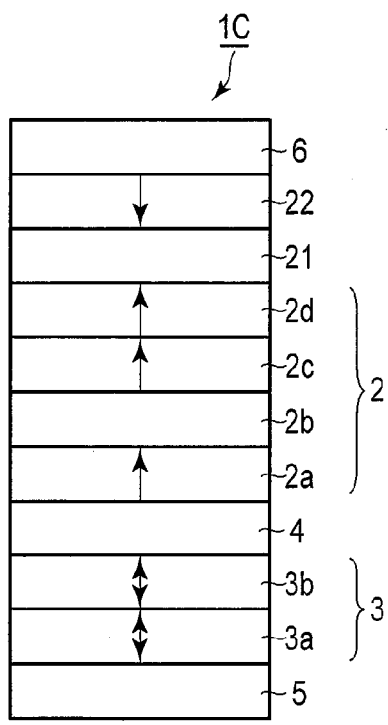
FIG. 4 is a sectional view of a magnetoresistive element according to a fourth embodiment.

FIG. 4 is a sectional view of a magnetoresistive element according to the fourth embodiment.

A magnetoresistive element 1C according to the fourth embodiment has the configuration of the magnetoresistive element 1A according to the second embodiment shown in FIG. 2 wherein a nonmagnetic layer 21 and a bias layer 22 are inserted between a fixed layer 2 and a cap layer 6.

In the magnetoresistive element 1C having such a configuration, an interface magnetic film 3b is in contact with a nonmagnetic layer 4, and therefore has the effect of lessening a lattice mismatch at the interface, as in the second embodiment. Moreover, the use of a material having high spin polarization for the interface magnetic film 3b allows a high TMR ratio and high spin transfer torque efficiency.

Furthermore, as in the third embodiment, the bias layer 22 is a perpendicular magnetization film made of a ferromagnetic body and having a magnetization easy axis in the direction perpendicular to the film plane. The magnetization direction of the bias layer 22 is fixed to a direction opposite to the magnetization direction of the fixed layer 2. The bias layer 22 has the effect of lessening and adjusting the shift of a switching current of a storage layer 3 which results from the leakage magnetic field from the fixed layer 2 and which is a drawback when the element is fabricated.

Fifth Embodiment

FIG. 5 is a sectional view of a magnetoresistive element according to the fifth embodiment.

A magnetoresistive element 1D according to the fifth embodiment has the configuration of the magnetoresistive element 1B according to the third embodiment shown in FIG. 3 wherein a third magnetic material film 2d included in a fixed layer 2 is eliminated.

In the present embodiment, the magnetizations of the fixed layer 2 and a bias layer 22 are magnetically coupled via a nonmagnetic layer 21 and are fixed to opposite directions. The bias layer 22 has the effect of lessening and adjusting the shift of a switching current of a storage layer 3 which results from the leakage magnetic field from the fixed layer 2 and which is a drawback when the element is fabricated.

Sixth Embodiment

FIG. 6 is a sectional view of a magnetoresistive element according to the sixth embodiment.

A magnetoresistive element 1E according to the sixth embodiment has the configuration of the magnetoresistive element 1C according to the fourth embodiment shown in FIG. 4 wherein a third magnetic material film 2d included in a fixed layer 2 is eliminated.

In the present embodiment, the magnetizations of the fixed layer 2 and a bias layer 22 are magnetically coupled via a nonmagnetic layer 21 and are fixed to opposite directions. The configuration and advantageous effects are similar in other respects to those according to the fourth embodiment.

In the first to sixth embodiments described above, what is known as a top pin structure has been shown in which the storage layer 3 is formed on the underlying layer 5 and the fixed layer 2 is formed on the nonmagnetic layer 4. Instead, what is known as a bottom pin structure may be used in which the fixed layer 2 is formed on the underlying layer 5 and the storage layer 3 is formed on the nonmagnetic layer 4.

[Regarding Layers in the First to Sixth Embodiments]

Now, the layers used in the first to sixth embodiments are described below.

[1] Storage Layer

First, the storage layer in the first to sixth embodiments is described below. When a perpendicular magnetization film is used as the storage layer 3, shape anisotropy is not used, as described above. Therefore, the element shape can be smaller than that of an in-plane magnetization configuration. The use of a material having high perpendicular magnetic anisotropy enables the maintenance of thermal disturbance resistance and also enables both miniaturization and current reduction. The properties to be provided in the storage layer 3 and specific examples of materials to be selected are described below in detail.

(1) Properties to be Provided in the Storage Layer

When a perpendicular magnetization material is used as the storage layer 3, its thermal disturbance index Δ is represented as in Equation (1) below by taking the ratio between effective anisotropy energy ($K_u^{eff} \cdot V$) and heat energy ($k_B T$).

$$\Delta = K_u^{eff} \cdot V/(k_B T) = (K_u - 2\pi N M_S^2) \cdot Va/(k_B T) \qquad (1)$$

wherein $K_u^{eff}$: effective perpendicular magnetic anisotropy
V: volume of perpendicular magnetization material
T: temperature of perpendicular magnetization material
$k_B$: Boltzmann constant
$K_u$: perpendicular magnetic anisotropy
$M_S$: saturation magnetization
N: demagnetization factor
Va: magnetization reversal unit volume.

In order to avoid the problem of magnetization fluctuation caused by heat energy (thermal disturbance), the thermal disturbance index Δ preferably shows a value higher than 60. However, if the element size or film thickness is reduced to allow for the increase of capacity, the magnetization reversal unit volume Va is reduced, and there is fear that storage cannot be maintained (=thermal disturbance) and becomes unstable. Therefore, it is preferable to select, for the storage layer 3, a material high in perpendicular magnetic anisotropy $K_u$ and/or low in saturation magnetization $M_S$.

In the meantime, a critical current $I_C$ necessary for magnetization reversal by the perpendicular magnetization type spin transfer torque writing is generally proportional to $\alpha/(\eta \cdot \Delta)$, wherein α: magnetic relaxation constant
η: spin transfer torque efficiency constant.

(2) Material of Storage Layer

As described above, in order for the storage layer 3 to be a perpendicular magnetization film and in order to enable both high thermal disturbance resistance and low-current magnetization reversal, it is preferable that the material of the storage layer has low saturation magnetization $M_S$, has perpendicular magnetic anisotropy $K_u$ high enough to maintain the thermal disturbance index Δ, and shows high polarizability. A more detailed explanation is given below.

The storage layer 3 includes Co and Pd, an alloy containing Pt, or an alloy in which 0 to 30 at % of boron (B) is added to one or more of Co, Fe, and Ni, or a stack structure of these materials. An underlying layer having an oriented close-packed face is properly selected as the underlying layer 5 shown in FIG. 1 to FIG. 6 to control the crystal orientation of the storage layer 3 so that the storage layer 3 is a perpendicular magnetization film. Details of the underlying layer 5 and its specific manufacturing method will be described later.

FIG. 7 shows the Pd concentration dependence of the effective perpendicular magnetic anisotropy $K_u^{eff}$ of a CoPd film used as the storage layer 3. The horizontal axis indicates the Pd concentration, and the vertical axis indicates the effective magnetic anisotropy $K_u^{eff}$.

As apparent from FIG. 7, a Pd concentration of 30 at % or more permits a high perpendicular magnetic anisotropy of $1 \times 10^7$ (erg/cm$^3$) or more. This high perpendicular magnetic anisotropy enables a magnetoresistive element showing high thermal stability to be provided despite miniaturization. The storage layer 3 may contain additional elements such as Fe, Ni, B, and V.

[2] Fixed Layer

Now, the fixed layer 2 according to the first to sixth embodiments is described. For the fixed layer 2, it is preferable to select a material and a multilayer film structure which do not easily change the magnetization direction, in contrast to the storage layer 3. That is, it is preferable to select a material and a multilayer film structure which are high in effective magnetic anisotropy $K_u^{eff}$ and saturation magnetization $M_S$ and which are high in magnetic relaxation constant α.

(1) Third Magnetic Material Film 2d of Fixed Layer

The following materials are used for the third magnetic material film 2d that constitutes the fixed layer 2 in the first to fourth embodiments.

(a) Artificial Lattice

Artificial lattice includes a structure having alternately stacked layers of an alloy (magnetic layer) which includes at least one of Fe, Co, and Ni and an alloy (nonmagnetic layer) which includes at least one of Cr, Pt, Pd, Ag, Ir, Rh, Ru, Os, Re, Au, Cu, Gd, Tb, and Dy.

For example, such artificial lattice includes Co/Pt artificial lattice, Co/Pd artificial lattice, CoCr/Pt artificial lattice, Co/Ru artificial lattice, Co/Os artificial lattice, Co/Au artificial lattice, and Ni/Cu artificial lattice. Examples of an artificial lattice structure that uses two magnetic layers include Co/Ni artificial lattice and Fe/Ni artificial lattice. The effective magnetic anisotropy and the saturation magnetization of such artificial lattice can be adjusted by adjusting the addition of an element to the magnetic layer, the thickness ratio between the magnetic layer and the nonmagnetic layer, and the stacking period.

(b) Ordered Alloys

Ordered alloys include an alloy which includes one or more of Fe, Co, and Ni and which include one or more of Pt and Pd. The crystal structure of this alloy is an $L1_0$ ordered alloy. The $L1_0$ ordered alloy includes, for example, $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. The composition ratios in these ordered alloys are illustrative are not limited.

The effective magnetic anisotropy and the saturation magnetization can be adjusted by adding, to these ordered alloys, an impurity element such as Cu, Cr, Ag, or B, or an alloy of these elements, or an insulator.

(c) Disordered Alloys

Disordered alloys include a metal which includes cobalt (Co) as the main component and which includes one or more of Cr, Ta, Nb, V, W, Hf, Ti, Zr, Pt, Pd, B, Fe, and Ni.

The disordered alloys include, for example, a CoCr alloy, a CoPt alloy, a CoCrPt alloy, a CoCrPtTa alloy, and a CoCrNb alloy. The effective magnetic anisotropy and the saturation magnetization of these alloys can be adjusted by changing the ratio of a nonmagnetic element.

(d) Rare Earth Metal (RE)-Transition Metal (TM) Alloy

An alloy of a rare earth metal and a transition metal enables both a ferrimagnetic material and a ferromagnetic material to be obtained by the material of the rare earth metal.

Specific examples of the ferrimagnetic material include an alloy which includes Tb, Dy, or Gd, and an at least one of Fe, Co, and Ni. Such ferrimagnetic materials include, for example, TbFe, TbCo, TbFeCo, DyTbFeCo, and GdTbCo.

Specific examples of the ferromagnetic material include an alloy which includes Sm, Nd, Ho, and at least one of Fe, Co, and Ni. Such ferromagnetic materials include, for example, $SmCo_5$ and NdFeB. The magnetic anisotropy and the saturation magnetization of these alloys can be adjusted by adjusting the composition ratio.

(2) Stack Structure of Fixed Layer

The fixed layer 2 according to the first to fourth embodiments has a structure in which the first magnetic material film 2a, the nonmagnetic material film 2b, the second magnetic material film 2c, and the third magnetic material film 2d are stacked in this order from the side contacting the nonmagnetic layer 4.

The first magnetic material film 2a is made of a material including at least one of Co, Fe, and Ni, or an alloy in which 0 to 30 at % of at least one of B, Al, and Si is added to the above material, or a multilayer film structure that includes the above materials.

The nonmagnetic material film 2b is made of a material comprising at least one of Ta, Zr, Nb, Mo, Ru, Ti, V, Cr, W, Hf, Pt, Pd, Rh, and Ir.

The second magnetic material film 2c is made of a material which includes Co as the main component and which may include, as an additional element, at least one of Fe, Ni, B, Al, Si, Ta, Zr, Nb, Mo, Ru, Ti, V, Cr, W, and Hf.

The enlarged sectional view in FIG. 1 illustrates that the second magnetic material film 2c is Co and the third magnetic material film 2d is Co/Pt artificial lattice.

The Co of second magnetic material film 2c is thicker than the Co of the Co/Pt artificial lattice. For example, the Co thickness of second magnetic material film 2c is 7 Å, and the Co thickness of the Co/Pt artificial lattice is 3 Å. The Pt thickness of the Co/Pt artificial lattice is 7 Å.

The Co thickness of the second magnetic material film 2c, the Co thickness of the Co/Pt artificial lattice, and the Pt thickness of the Co/Pt artificial lattice are respectively not limited 7 Å, 3 Å, and 7 Å. For example, the Co thickness of second magnetic material film 2c, the Co thickness of the Co/Pt artificial lattice, and the Pt thickness of the Co/Pt artificial lattice may respectively range from 4 Å to 20 Å, from 2 Å to 8 Å, and from 2 Å to 15 Å. However, as mentioned above, the Co of the second magnetic material film 2c is thicker than the Co of the Co/Pt artificial lattice.

The fixed layer 2 can be thinner by adopting the Co/Pt artificial lattice with the smaller Co thickness than the Co thickness of the second magnetic material film 2c. The thinner fixed layer 2 brings about the thinner bias layer (shift adjustment layer) 22.

The third magnetic material film 2d may employ other artificial lattice except for the Co/Pt artificial lattice. The other artificial lattice is, for example, CoCr/Pt artificial lattice, Co/Ru artificial lattice, Co/Os artificial lattice, Co/Au artificial lattice, and Ni/Cu artificial lattice, Co/Ni artificial lattice, or Fe/Ni artificial lattice.

Relating to the Co/Ru artificial lattice, Co/Os artificial lattice, Co/Au artificial lattice, and Co/Ni artificial lattice, the thickness of Co and the thickness of nonmagnetic metal (Ru, Os, Au, Ni) are respectively 2 Å-8 Å, and 2 Å-15 Å as in the case of Co/Pt artificial lattice.

Relating to the CoCr/Pt artificial lattice, Ni/Cu artificial lattice, the thickness of nonmagnetic metal (Pt, Cu, Ni) is 2 Å-15 Å as in the case of Co/Pt artificial lattice.

In order to obtain a high TMR ratio and high heat treatment resistance, it is preferable that the Co concentration of the second magnetic material film 2c is higher than the Co concentration of the first magnetic material film 2a. For example, the surface of the second magnetic material film 2c where the second magnetic material film 2c contacts the third magnetic material film 2d is higher in Co concentration than the surface of the first magnetic material film 2a where the nonmagnetic layer 4 contacts the first magnetic material film 2a.

FIG. 8A shows the dependence of the TMR ratio on the thickness of the second magnetic material film 2c in the magnetoresistive element. Sample A is the magnetoresistive element in which the second magnetic material film 2c is higher in Co concentration than the first magnetic material film 2a. Sample B is the magnetoresistive element in which the second magnetic material film 2c has the same Co concentration as the first magnetic material film 2a.

It is apparent from FIG. 8A that Sample A shows higher TMR ratio than Sample B at all thickness. That is, Sample A shows a TMR ratio of 120% and satisfactory characteristics at a thickness of 5 Å to 30 Å. On the other hand, in Sample B, the magnetization easy axis of the fixed layer 2 is in a in-plane direction when the thickness of the second magnetic material film 2c is 13 Å. Therefore, the antiparallel magnetization state is not obtained, and no TMR ratio is obtained. It is found out from magnetization curves that, in the whole thickness region of Sample A, the fixed layer 2 is magnetized in the direction perpendicular to the film plane even if no external magnetic field is applied thereto.

FIG. 8B shows the change of the TMR ratio with the heat treatment temperature. The vertical axis indicates the TMR ratio after the heat treatment wherein the TMR ratio before the heat treatment is 1, and the horizontal axis indicates the heat treatment temperature. Samples a, b, and c are produced from Sample A by setting the thickness of the second magnetic material film 2c to 13 Å, 10 Å, and 4 Å, respectively. Sample d is produced from Sample B by setting the thickness of the second magnetic material film 2c to 4 Å.

It is apparent from FIG. 8B that Samples a, b, and c is lower than Sample d in regard to the deterioration of the TMR ratio attributed to the heat treatment. It is also apparent that in Samples a, b, and c, the deterioration of the TMR ratio is reduced along with the increase of thickness and the heat treatment resistance is improved.

However, it is found out that Sample c is greater than Samples a and b in the deterioration of the TMR ratio at 300° C. or more.

A magnetic field leaking to the storage layer increases if the thickness of the second magnetic material film 2c increases. Therefore, the thickness of the second magnetic material film 2c cannot be more than 20 Å. It is thus preferable that the thickness of the second magnetic material film 2c is more than 4 Å and is 20 Å or less.

Here, a stack structure in which the first magnetic material film 2a, the nonmagnetic material film 2b, and the second magnetic material film 2c are stacked in this order from the side of the nonmagnetic layer 4 is shown as an experimental example. However, similar advantageous effects can also be expected by a stack structure having two or more magnetic material films and two or more nonmagnetic material films, for example, a stack structure comprising the first magnetic material film 2a, the nonmagnetic material film 2b, the first magnetic material film 2a, the nonmagnetic material film 2b, and the second magnetic material film 2c from the side of the nonmagnetic layer 4, or a stack structure comprising the first magnetic material film 2a, the nonmagnetic material film 2b, the second magnetic material film 2c, the nonmagnetic material film 2b, and the second magnetic material film 2c from the side of the nonmagnetic layer 4.

When a material higher in Co concentration than the first magnetic material film 2a is used as the second magnetic material film 2c and when the thickness of the second magnetic material film 2c is 5 Å to 20 Å, the concentration distributions and thickness of the first magnetic material film 2a and the second magnetic material film 2c that contain C can be identified by an analysis that uses electron energy loss spectroscopy (TEM-EELS) for a transmission electron microscope or secondary ion mass spectrometry (SIMS). Moreover, the concentration distributions and thickness can also be identified in the magnetoresistive element by using energy dispersive X-ray spectrometry (TEM-EDX).

In the fixed layer 2 according to fifth and sixth embodiments, the constituent films other than a third magnetic material film 2d have the above-mentioned materials and characteristics, so that similar advantageous effects can be expected.

(3) Interface Magnetic Films of Storage Layer and Fixed Layer

Here, the interface magnetic film is the first magnetic material film 2a that constitutes the fixed layer 2 in the first to sixth embodiments, and is the interface magnetic film 3b that constitutes the storage layer 3 in the second and fourth to sixth embodiments. These interface magnetic films have a configuration in which magnetic material layers and nonmagnetic material layers are repeatedly stacked for one or more periods. The interface magnetic film is an alloy which includes at least one of Co, Fe, and Ni.

When oxides having an NaCl structure are used for the nonmagnetic layer 4, the oxides having an NaCl structure allow a (100) face to be easily grown as a preferential orientation face if crystals of these oxides are grown (i) on, for example, an amorphous CoFeNiB alloy which includes one or more of Fe, Co, and Ni, or (ii) on an alloy which has a body-centered cubic (BCC) structure and which has a (100) preferential orientation face and which includes one or more of Fe, Co, and Ni. In particular, the (100) face can be extremely easily preferentially oriented on a CoFeX (X represents at least one of the elements B, C, and N) amorphous alloy to which B, C, or N is added. It is therefore preferable that the magnetic material layer contacting the nonmagnetic layer 4 is an alloy $(Co_{100-x}Fe_x)_{100-y}B_y$ (0≤y≤30 at %) which contains Co, Fe, and Ni.

An element having a high melting point which includes at least one of Ta, W, Hf, Zr, Nb, Mo, Ti, V, and Cr, or an alloy of these elements is preferably used for the nonmagnetic material layer included in the interface magnetic film. When Ta is used for the nonmagnetic material layer and CoFeB is used for the magnetic material layer, the distribution shows that the concentration of B is higher at points closer to the Ta layer because B in CoFeB of the magnetic material layer is drawn to Ta after the heat treatment.

The interface magnetic film has a configuration in which magnetic material layers and nonmagnetic material layers are repeatedly stacked for one or more periods. The magnetic material layer preferably has magnetic exchange coupling via the nonmagnetic material layer, that the nonmagnetic material layer is preferably 10 Å or less and particularly preferably 5 Å or less. This permits the magnetization direction of the interface magnetic film to be aligned with the magnetization directions of the magnetic film 3a and the magnetic film 2a.

[3] Underlying Layer

As in the above description of the storage layer, it is necessary to have a structure that allows an atom dense face to be easily oriented, in order to form a perpendicular magnetization film having a magnetization easy axis in the direction perpendicular to the film plane. That is, the crystal orientation needs to be controlled so that the (111) face of the face-centered cubic (FCC) structure and the (001) face of a hexagonal close-packed (HCP) structure are oriented. Therefore, the selection of an underlying layer material and a stack configuration is important.

(1) Stack Configuration of Underlying Layer

Figure 9:
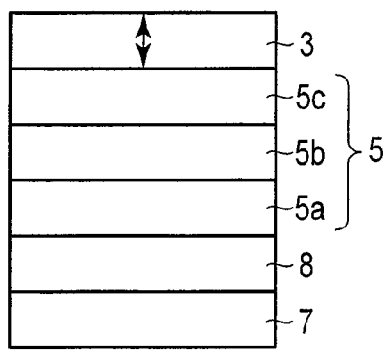
FIG. 9 is a sectional view of a stack structure including an underlying layer and a storage layer in the magnetoresistive element according to the embodiment.

FIG. 9 is a sectional view of a stack structure comprising the underlying layer 5 and the storage layer 3 in the magnetoresistive element according to the embodiment.

In this stack structure, for example, Ta having a thickness of about 5 nm is provided as a contact layer 8 between a lower electrode 7 and the underlying layer 5. The underlying layer 5 has a stack structure in which underlying films 5a, 5b, and 5c are stacked in this order. For example, a CoPd layer having a thickness of about 2 nm is provided as the storage layer 3 on the underlying layer 5. The configuration above the storage layer 3 is as shown in FIG. 1 to FIG. 6.

In the magnetoresistive element according to the first to sixth embodiments, the underlying film 5c included in the underlying layer 5 is preferably made of a metal material that lattice-matches the storage layer 3. The underlying film 5a preferably include a material and a configuration that allow the underlying films 5b and 5c to be smooth and to be improved in crystal orientation. The underlying films 5b and 5c are preferably made of a Ru layer having a thickness of about 3 nm and a Pt layer having a thickness of about 3 nm, respectively.

(2) Material of Underlying Layer

Now, specific materials of the underlying films 5a, 5b, and 5c that constitute the underlying layer 5 are described.

A metal having a dense structure is used as the underlying film 5c. Metals which lattice-match the storage layer 3, for example, a CoPd alloy or a CoPt alloy and which have a close-packed structure include, for example, Pt, Pd, Ir, and Ru. For example, instead of one metal element, an alloy comprising two metal elements such as Pt—Pd or Pt—Ir or three or more metal elements may be used. It is also possible to use alloys of the above-mentioned metals and fcc metals such as Cu, Au, and Al: Pt—Cu, Pd—Cu, Ir—Cu, Pt—Au, Ru—Au, Pt—Al, and Ir—Al, or to use alloys of Re, Ti, Zr, and Hf and hcp metals: Pt—Re, Pt—Ti, Ru—Re, Ru—Ti, Ru—Zr, and Ru—Hf.

As an extremely large thickness of the underlying layer 5 leads to lower smoothness, the thickness range of the underlying layer 5 is preferably 30 nm or less. The underlying films 5b and 5c are stacked in order to stack materials having different lattice constants so that the lattice constant is adjusted before the formation of a CoPd alloy or a CoPt alloy. For example, if Ru is formed for the underlying film 5b and Pt is formed for the underlying film 5c, Pt of the underlying film 5c will have a lattice constant different from a bulk lattice constant due to Ru of the underlying film 5b. However, as described above, the lattice constant can be adjusted even when an alloy is used. Therefore, one of the underlying films 5b and 5c can be omitted.

In the underlying layer 5, the underlying film 5a is used to improve smoothness and to improve the crystal orientation of the metals of the underlying films 5b and 5c having close-packed structures. More specifically, Ta, for example, is used for the underlying film 5a. If the thickness of the underlying film 5a is too large, it takes a long time to form the underlying film 5a, leading to lower productivity. If the thickness of the underlying film 5a is too small, the above-mentioned effect of controlling orientation is lost. It is therefore preferable that the thickness of the underlying film 5a ranges from 1 nm to 10 nm.

[4] Nonmagnetic Layer

The material of the nonmagnetic layer 4 in the first to sixth embodiments is preferably an oxide having an NaCl structure. Such an oxide includes, for example, MgO, CaO, SrO, TiO, VO, and NbO. These oxides having an NaCl structure allow a (100) face to be easily grown as a preferential orientation face if crystals of these oxides are grown (i) on, for example, an amorphous CoFeNiB alloy which includes, as the main component, one or two or more of Fe, Co, and Ni, or (ii) on an alloy which has a body-centered cubic (BCC) structure and which has a (100) preferential orientation face and which includes, as the main component, one or two or more of Fe, Co, and Ni.

In particular, the (100) face can be extremely easily preferentially oriented on a CoFeX (X represents at least one of the elements B, C, and N) amorphous alloy to which B, C, or N is added.

When the magnetization direction of the storage layer 3 is antiparallel to the magnetization direction of the fixed layer 2, a spin-polarized $\Delta_1$ band takes charge of tunneling conduction. Therefore, majority spin electrons alone contribute to conduction. As a result, the magnetoresistive element decreases in conductivity and increases in resistance value.

On the contrary, when the magnetization direction of the storage layer 3 is parallel to the magnetization direction of the fixed layer 2, a $\Delta_5$ band that is not spin-polarized dominates conduction. Therefore, the magnetoresistive element increases in conductivity and decreases in resistance value. Thus, the formation of the $\Delta_1$ band is the point in developing a high TMR ratio. In order to form the $\Delta_1$ band, the interfaces between the (100) face of the nonmagnetic layer 4 made of an oxide having an NaCl structure and the storage layer 3 as well as the fixed layer 2 have to be well consistent.

It is preferable that the storage layer and the fixed layer have stack structures as described above to further improve the lattice match in the (100) face of the nonmagnetic layer 4 made of an oxide layer having an NaCl structure. From the viewpoint of forming the $\Delta_1$ band, it is preferable that such materials that the lattice mismatch in the (100) face of the nonmagnetic layer 4 is 5% or less are selected as the interface magnetic film 3b that constitutes the storage layer 3 and the interface magnetic film 2a that constitutes the fixed layer 2.

[5] Bias Layer

As shown in FIG. 3 to FIG. 6, the nonmagnetic layer 21 and the bias layer (shift adjustment layer) 22 may be disposed between the fixed layer 2 and the cap layer 6. This makes it possible to lessen and adjust of the shift of a switching current of the storage layer 3 resulting from the leakage magnetic field from the fixed layer 2.

It is preferable that the nonmagnetic layer 21 has thermal resistance that prevents the fixed layer 2 and the bias layer 22 from being mixed by a thermal process and also has a function to control crystal orientation during the formation of the bias layer 22. As the increase of the thickness of the nonmagnetic layer 21 increases the distance between the bias layer 22 and the storage layer 3, a shift adjustment magnetic field applied to the storage layer 3 from the bias layer 22 is reduced. It is therefore preferable that the thickness of the nonmagnetic layer 21 is 5 nm or less.

The bias layer 22 is made of a ferromagnetic body having a magnetization easy axis in the direction perpendicular to the film plane. More specifically, the materials listed for the fixed layer 2 can be used. However, as the bias layer 22 is farther from the storage layer 3 than the fixed layer 2, the thickness or the saturation magnetization $M_S$ of the bias layer 22 needs to be set to be more than that of the fixed layer 2 so that the leakage magnetic field applied to the storage layer 3 is adjusted by the bias layer 22.

That is, Equation (2) below needs to be satisfied $$M_{S2} \times t_2 < M_{S22} \times t_{22} \qquad (2)$$

wherein $t_2$ and $M_{S2}$ are the thickness or the saturation magnetization of the fixed layer 2, and $t_{22}$ and $M_{S22}$ are the thickness or the saturation magnetization of the bias layer 22.

For example, suppose that the element is fabricated into a size of 50 nm. In this case, a magnetic material having a saturation magnetization $M_S$ of 1000 emu/cm$^3$ and a thickness of 5 nm is used for the fixed layer 2 to offset the shift of the switching current. Accordingly, the required characteristics are as follows: The thickness of the nonmagnetic layer 21 is 3 nm. The saturation magnetization $M_S$ of the bias layer 22 is 1000 emu/cm$^3$. The thickness of the bias layer 22 is about 15 nm.

In order to obtain the effect of canceling the above-mentioned shift of the switching current, the magnetization directions of the fixed layer 2 and the bias layer 22 need to be set to be antiparallel to each other. To satisfy this relation, it is possible to select such materials that the coercive force $H_{c2}$ of the fixed layer 2 and the coercive force $H_{c22}$ of the bias layer 22 satisfy the relation $H_{c2} > H_{c22}$ or $H_{c2} < H_{c22}$. In this case, the magnetization directions of the fixed layer 2 and the bias layer 22 can be set to be antiparallel to each other by switching the magnetization direction of the layer lower in coercive force by minor loop magnetization in advance.

The magnetization directions of the fixed layer 2 and the bias layer 22 can also be set to be antiparallel to each other by the synthetic anti-ferromagnetic (SAF) coupling of the fixed layer 2 and the bias layer 22 via the nonmagnetic layer 21.

More specifically, Ru, for example, is used as the material of the nonmagnetic layer 21 so that the magnetization directions of the fixed layer 2 and the bias layer 22 can also be coupled to be antiparallel to each other. Thus, the magnetic field leaking from the fixed layer 2 can be reduced by the bias layer 22, so that the shift of the switching current of the storage layer 3 can be reduced. As a result, element-to-element variation of the switching current of the storage layer 3 can also be reduced.

Although the nonmagnetic layer 21 and the bias layer 22 are disposed between the fixed layer 2 and the cap layer 6 in the example described above, the nonmagnetic layer and the bias layer (shift adjustment layer) may be disposed between the storage layer 3 and the underlying layer 5. In this case, the shift of the switching current of the storage layer 3 resulting from the leakage magnetic field from the fixed layer 2 can be lessened and adjusted. The nonmagnetic layers and the bias layers (shift adjustment layers) may be disposed between the fixed layer 2 and the cap layer 6 and between the storage layer 3 and the underlying layer 5.

As described above, according to the first to sixth embodiments, the Co concentration of the second magnetic material film 2c included in the fixed layer 2 is higher than the Co concentration of the first magnetic material film 2a, and the thickness of the second magnetic material film 2c is larger, so that it is possible to provide a magnetoresistive element which shows only a slight change in electric characteristics in response to a heat treatment after film formation and which has high thermal resistance. That is, it is possible to provide a magnetoresistive element for the spin transfer torque writing method which is thermally stable and which can inhibit the decrease of the magnetoresistance ratio.

Seventh Embodiment

A magnetic random access memory (MRAM) according to the seventh embodiment is described with reference to FIG. 10 and FIG. 11. The MRAM according to the seventh embodiment is configured to use the magnetoresistive element according to one of the first to sixth embodiments as a storage element. In the embodiment described below, the magnetoresistive element 1 according to the first embodiment is used as a magnetoresistive element.

Figure 10:
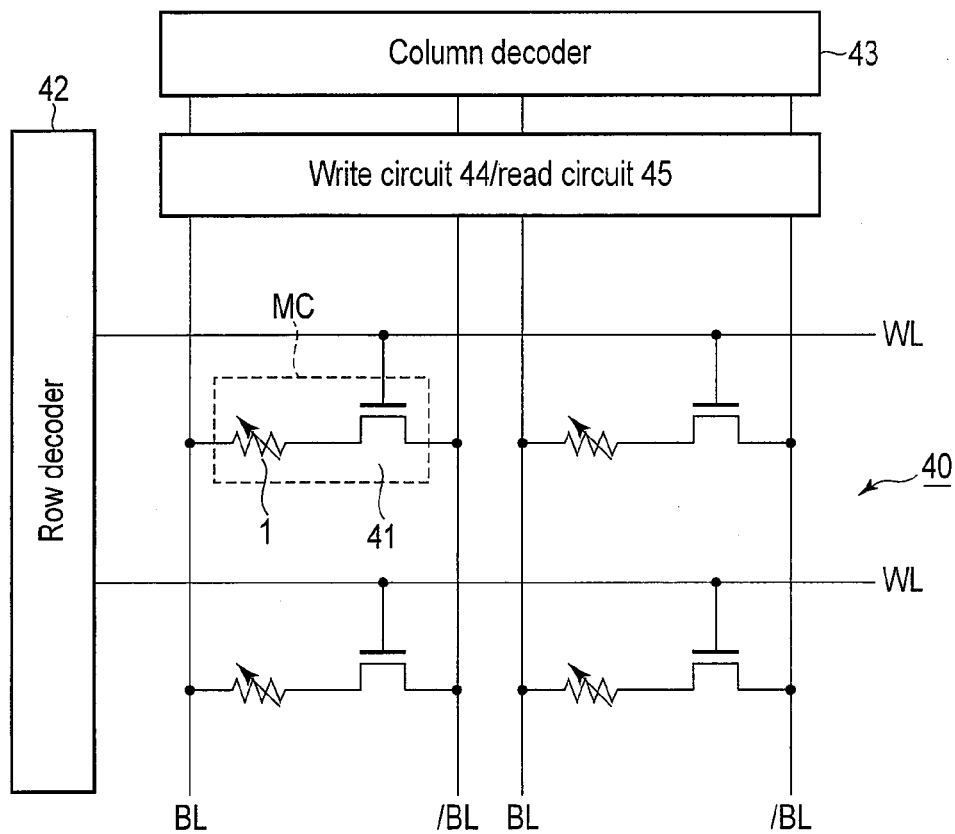
FIG. 10 is a circuit diagram showing the configuration of an MRAM according to a seventh embodiment.

FIG. 10 is a circuit diagram showing the configuration of the MRAM according to the seventh embodiment.

The MRAM according to the seventh embodiment includes a memory cell array 40 having memory cells MC arranged in matrix form. Pairs of bit lines BL, /BL are provided in the memory cell array 40 to extend in a column direction. Word lines WL are also provided in the memory cell array 40 to extend in a row direction.

A memory cell MC is located at the intersection of the bit line BL and the word line WL. Each memory cell MC includes the magnetoresistive element 1 and a select transistor (e.g. n-channel MOS transistor) 41. One end of the magnetoresistive element 1 is connected to the bit line BL. The other end of the magnetoresistive element 1 is connected to the drain terminal of the select transistor 41. The source terminal of the select transistor 41 is connected to the bit line /BL. The gate terminal of the select transistor 41 is connected to the word line WL.

A row decoder 42 is connected to the word line WL. A write circuit 44 and a read circuit 45 are connected to the pairs of bit lines BL, /BL. A column decoder 43 is connected to the write circuit 44 and the read circuit 45. Each memory cell MC is selected by the row decoder 42 and the column decoder 43.

Data is written into the memory cell MC as follows. First, in order to select a memory cell MC to write data into, the word line WL connected to this memory cell MC is activated. As a result, the select transistor 41 is turned on.

Here, a bi-directional write current Iw is supplied to the magnetoresistive element 1 in accordance with the data to be written. More specifically, when the write current Iw is supplied to the magnetoresistive element 1 from left to right, the write circuit 44 applies a positive voltage to the bit line BL, and applies a ground voltage to the bit line /BL. When the write current Iw is supplied to the magnetoresistive element 1 from right to left, the write circuit 44 applies a positive voltage to the bit line /BL, and applies a ground voltage to the bit line BL. In this way, data "0" or data "1" can be written into the memory cell MC.

Data is read from the memory cell MC as follows. First, the select transistor 41 of a memory cell MC to be selected is turned on. The read circuit 45 supplies the magnetoresistive element 1 with, for example, a read current Ir running from right to left, that is, supplies the read current Ir from the bit line /BL to the bit line BL. The read circuit 45 detects the resistance value of the magnetoresistive element 1 in accordance with the read current Ir. Further, the read circuit 45 reads data stored in the magnetoresistive element 1 from the detected resistance value.

Now, the structure of the MRAM according to the embodiment is described with reference to FIG. 11. FIG. 11 is a sectional view showing the structure of one memory cell MC.

As shown, the memory cell MC has the magnetoresistive element (MTJ) 1 and the select transistor 41. An element isolation insulating layer 46 is provided in the surface area of a p-type semiconductor substrate 51. The surface area of the semiconductor substrate 51 in which the element isolation insulating layer 46 is not provided is an element area (active area) in which elements are formed. The element isolation insulating layer 46 includes, for example, shallow trench isolation (STI). For example, silicon oxide is used for the STI.

A source area S and a drain area D that are separated from each other are formed in the element area of the semiconductor substrate 51. The source area S and the drain area D include n+ type diffusion areas formed by introducing a high-concentration impurity, for example, an n+ type impurity into the semiconductor substrate 51.

A gate insulating film 41A is formed on the semiconductor substrate 51 between the source area S and the drain area D. A gate electrode 41B is formed on the gate insulating film 41A. This gate electrode 41B functions as the word line WL. Thus, the select transistor 41 is provided on the semiconductor substrate 51.

A interconnect layer 53 is formed on the source area S via a contact 52. The interconnect layer 53 functions as the bit line /BL. A leader line 55 is formed above the drain area D via a contact 54.

The magnetoresistive element 1 intervening between a lower electrode 7 and an upper electrode 9 is provided above the leader line 55. A interconnect layer 56 is formed on the upper electrode 9. The interconnect layer 56 functions as the bit line BL. The space between the semiconductor substrate 51 and the interconnect layer 56 is filled with an interlayer insulating film 57 made of, for example, silicon oxide.

As described above in detail, according to the seventh embodiment, an MRAM can be configured by using the magnetoresistive element 1. The magnetoresistive element 1 can be used not only as a magnetic memory of a spin transfer torque writing type but also as a magnetic domain wall motion magnetic memory.

The MRAM shown in the seventh embodiment is applicable to various devices. Several applications of the MRAM are described below.

[1] Application 1

FIG. 12 shows an extracted DSL data path unit of a digital subscriber line (DSL) modem.

This modem includes, for example, a programmable digital signal processor (DSP) 100, an analog-digital (A/D) converter 110, a digital-analog (D/A) converter 120, a transmission driver 130, and a receiver amplifier 140.

A band pass filter is not shown in FIG. 12. Instead, an MRAM 170 according to the seventh embodiment and an electrically erasable and programmable ROM (EEPROM) 180 are shown as various types of optional memories for holding a line code program (program which is executed by the DSP and which selects and operates the modem in accordance with, for example, coded subscriber's line information and transmission conditions (line code: QAM, CAP, RSK, FM, AM, PAM, or DWMT)).

Although two kinds of memories: the MRAM 170 and the EEPROM 180 are used as the memories for holding the line code program in this application, the EEPROM 180 may be replaced by an MRAM. That is, the MRAM alone may be used instead of using two kinds of memories.

[2] Application 2

Figure 13:
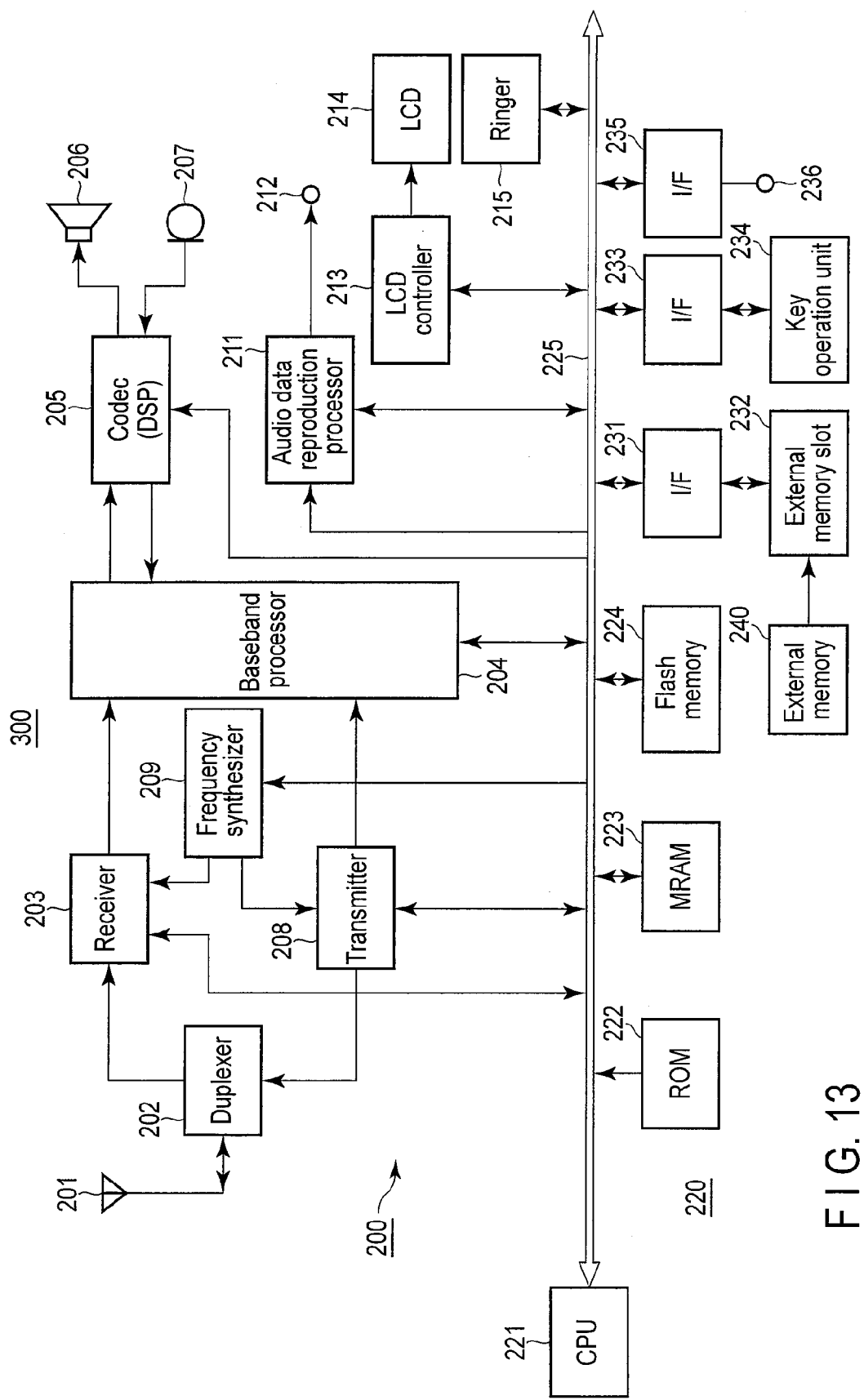
FIG. 13 is a block diagram showing a cell phone terminal as an application example.

FIG. 13 shows a mobile telephone terminal 300 as another application.

A communication section 200 that enables a communication function includes, for example, a sending/receiving antenna 201, an antenna duplexer 202, a receiver 203, a baseband processor 204, a digital signal processor (DSP) 205 used as an audio codec, a speaker (receiver) 206, a microphone (transmitter) 207, a transmitter 208, and a frequency synthesizer 209.

The mobile telephone terminal 300 is also provided with a control section 220 for controlling the components of the mobile telephone terminal 300. The control section 220 is a microcomputer which is formed by connecting a CPU 221, a ROM 222, an MRAM 223 according to the seventh embodiment, and a flash memory 224 via a bus 225.

Programs to be executed by the CPU 221 and necessary display data such as fonts are stored in the ROM 222 in advance.

The MRAM 223 is mainly used as a work area, and is used by the CPU 221 to store, as needed, data being calculated during the execution of the program, or used to temporarily store data exchanged between the control section 220 and each component.

The flash memory 224 is used to store setting parameters so that even if the mobile telephone terminal 300 is powered off, conditions set immediately before the power-off are stored to enable the same setting when the mobile telephone terminal 300 is powered on next. This prevents the disappearance of the stored setting parameters even if the mobile telephone terminal 300 is powered off.

The mobile telephone terminal 300 is also provided with an audio data reproduction processor 211, an external output terminal 212, an LCD controller 213, a liquid crystal display (LCD) 214 for display, and a ringer 215 which generates a ringing tone.

The audio data reproduction processor 211 reproduces audio data input to the mobile telephone terminal 300 (or audio information (audio data) stored in a later-described external memory 240). The reproduced audio data (audio information) can be transmitted to a headphone or a mobile speaker via the external output terminal 212 and thereby taken out.

Thus, the audio information can be reproduced by providing the audio data reproduction processor 211. The LCD controller 213 receives, for example, display information from the CPU 221 via the bus 225, converts the display information to LCD control information for controlling the LCD 214, and drives the LCD 214 to display the information.

Furthermore, the mobile telephone terminal 300 is provided with interface circuits (I/F) 231, 233, and 235, the external memory 240, an external memory slot 232, a key operation unit 234, and an external input/output terminal 236. The external memory 240, for example, a memory card is inserted into the external memory slot 232. The external memory slot 232 is connected to the bus 225 via the interface circuit (I/F) 231.

The slot 232 is thus provided in the mobile telephone terminal 300 such that information in the mobile telephone terminal 300 can be written into the external memory 240 or information (e.g. audio information) stored in the external memory 240 can be input to the mobile telephone terminal 300.

The key operation unit 234 is connected to the bus 225 via the interface circuit (I/F) 233. Key input information input from the key operation unit 234 is transmitted to, for example, the CPU 221. The external input/output terminal 236 is connected to the bus 225 via the interface circuit (I/F) 235. The external input/output terminal 236 functions as a terminal for inputting various kinds of information to the mobile telephone terminal 300 from the outside or outputting information from the mobile telephone terminal 300 to the outside.

Although the ROM 222, the MRAM 223, and the flash memory 224 are used in this application, the flash memory 224 may be replaced by an MRAM, and the ROM 222 can also be replaced by an MRAM.

[3] Application 3

FIG. 14 to FIG. 18 respectively show examples of how the MRAM is applied to cards (MRAM cards) such as smart media for storing media content.

As shown in FIG. 14, an MRAM card body 400 has an MRAM chip 401 therein. The card body 400 has an opening 402 formed in a position corresponding to the MRAM chip 401 so that the MRAM chip 401 is exposed. This opening 402 is provided with a shutter 403 so that the MRAM chip 401 is protected by the shutter 403 when the MRAM card is carried. The shutter 403 is made of a material such as ceramics having the effect of blocking an external magnetic field.

In order to transfer data, the shutter 403 is opened to expose the MRAM chip 401. An external terminal 404 takes out content data stored in the MRAM card.

Figure 16:
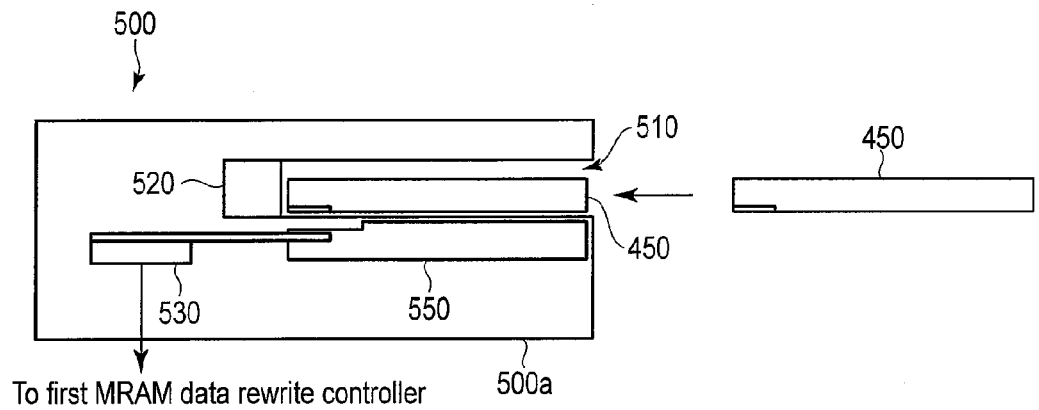
FIG. 16 is a sectional view of the card insertion type transfer apparatus as an application example.

FIG. 15 and FIG. 16 show a card insertion type transfer device for transferring data to the MRAM card.

A data transfer device 500 has a storage portion 500a. A first MRAM card 550 is stored in the storage portion 500a. The storage portion 500a is provided with an external terminal 530 which is electrically connected to the first MRAM card 550. This external terminal 530 is used to rewrite data in the first MRAM card 550.

A second MRAM card 450 used by an end user is inserted from an insertion portion 510 of the data transfer device 500 as indicated by an arrow, and pushed in until stopped by a stopper 520. This stopper 520 also serves as a member to align the first MRAM card 550 with the second MRAM card 450. When the second MRAM card 450 is located in a predetermined position, a control signal is supplied to the external terminal 530 from a first MRAM data rewrite controller, and data stored in the first MRAM card 550 is transferred to the second MRAM card 450.

Figure 17:
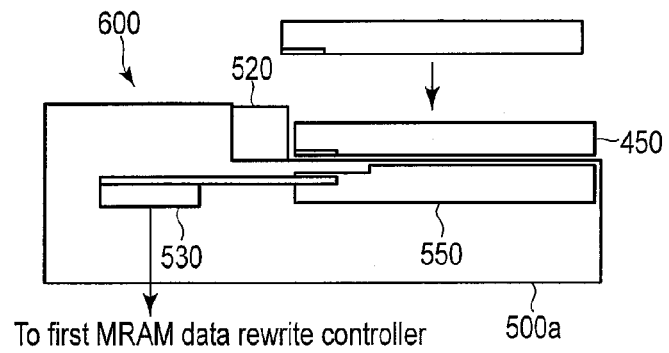
FIG. 17 is a sectional view of a fitting type transfer apparatus as an application example.

FIG. 17 is a sectional view showing a fit type transfer device for transferring data to the MRAM card.

A transfer device 600 is a type that mounts the second MRAM card 450 on the first MRAM card 550 in a fitting manner using the stopper 520 as a mark, as indicated by an arrow. The transfer method is the same as that of the card insertion type and is therefore not described.

Figure 18:
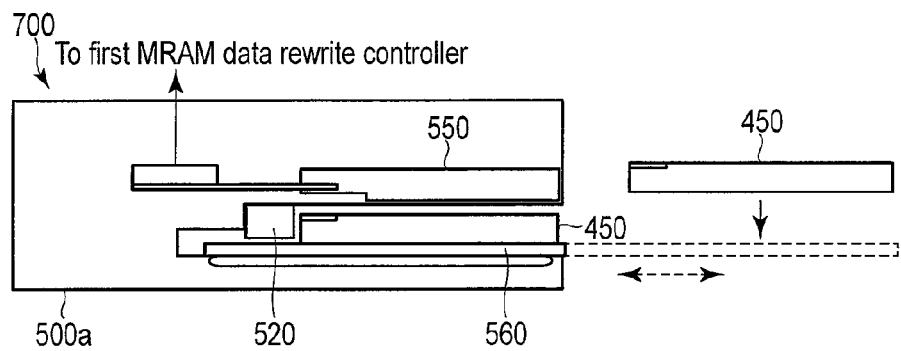
FIG. 18 is a sectional view of a sliding type transfer apparatus as an application example.

FIG. 18 is a sectional view showing a slide type transfer device for transferring data to the MRAM card.

A transfer device 700 is provided with a tray slide 560 as in a CD-ROM drive or a DVD drive. This tray slide 560 moves as indicated by an arrow. When the tray slide 560 has moved to the position indicated by a broken line, the second MRAM card 450 is mounted on the tray slide 560, and the tray slide 560 then moves to convey the second MRAM card 450 into the transfer device 700.

The slide type transfer device is the same as the card insertion type transfer device in that the second MRAM card 450 is conveyed so that the tip of the second MRAM card 450 comes into contact with the stopper 520, and in the transfer method. Therefore, no explanations are given in these respects.

The MRAM described in the seventh embodiment can be used in a file memory capable of high-speed random writing, a mobile terminal capable of high-speed downloading, a mobile player capable of high-speed downloading, a semiconductor memory for broadcasting devices, a drive recorder, a home video, a high-capacity buffer memory for communication, and a semiconductor memory for a security camera, thus providing many industrial advantages.

As described above, according to the embodiments, it is possible to provide a magnetoresistive element for the spin transfer torque writing method which is thermally stable and which can inhibit the decrease of the magnetoresistance ratio, and also provide a magnetic memory that uses such a magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer;
a second magnetic layer; and
a nonmagnetic layer provided between the first magnetic layer and the second magnetic layer,
wherein the first magnetic layer has a structure in which a first magnetic material film is provided in contact with the nonmagnetic layer, a nonmagnetic material film is provided in contact with the first magnetic material film, a second magnetic material film is provided in contact with the nonmagnetic material film, and a third magnetic material film is provided in contact with the second magnetic material film,
the second magnetic material film has a Co concentration higher than that of the first magnetic material film, and the second magnetic material film is in direct contact with the third magnetic material film, and
the first magnetic material film has a magnetization direction parallel to that of the second magnetic material film.

2. The element according to claim 1, wherein a surface of the second magnetic material film where the second magnetic material film contacts the third magnetic material film is higher in Co concentration than a surface of the first magnetic material film where the nonmagnetic layer contacts the first magnetic material film.

3. The element according to claim 1, wherein a thickness of the second magnetic material is more than 4 Å and is 20 Å or less.

4. The element according to claim 1, wherein the second magnetic layer comprises two films different in material.

5. The element according to claim 1, further comprising a third magnetic layer located on a surface of the first magnetic layer, which is opposite to a surface where the nonmagnetic material layer is located,
wherein the third magnetic layer has a magnetization direction antiparallel to the magnetization direction of the first magnetic layer.

6. The element according to claim 1, further comprising a fourth magnetic layer located on a surface of the second magnetic layer, which is opposite to a surface where the nonmagnetic material layer is located,
wherein the fourth magnetic layer has a magnetization direction antiparallel to the magnetization direction of the first magnetic layer.

7. The element according to claim 1, wherein the third magnetic material film comprises an artificial lattice structure or an alloy which includes at least one of Fe, Co, and Ni and at least one of Cr, Pt, Pd, Ag, Ir, Rh, Ru, Os, Re, Au, Cu, Gd, Tb, and Dy.

8. The element according to claim 1, wherein the first magnetic material film comprises a material including at least one of Co, Fe, and Ni, or an alloy in which at least one of B, Al, and Si is added to the material.

9. The element according to claim 1, wherein the nonmagnetic material film comprises at least one of Ta, Zr, Nb, Mo, Ru, Ti, V, Cr, W, and Hf.

10. The element according to claim 1, wherein the second magnetic material film comprises cobalt (Co) as a main component.

11. A magnetic memory comprising:
a memory cell including the magnetoresistive element according to claim 1;
a first interconnect to which one end of the magnetoresistive element is electrically connected; and
a second interconnect to which the other end of the magnetoresistive element is electrically connected.

12. The magnetoresistive element according to claim 11, further comprising a select transistor provided between one end of the magnetoresistive element and the first interconnect.

13. The magnetoresistive element according to claim 1, wherein
the first magnetic layer has an axis of easy magnetization perpendicular to a film plane, and an invariable magnetization direction,
the second magnetic layer has an axis of easy magnetization perpendicular to a film plane, and a variable magnetization direction, and
a current is passed across the first magnetic layer and the second magnetic layer via the nonmagnetic layer so that the magnetization direction of the second magnetic layer varies.

* * * * *